(12) United States Patent
Chen et al.

(10) Patent No.: US 7,443,694 B1
(45) Date of Patent: Oct. 28, 2008

(54) 25 DEGREE TOOL-LESS EXPANSION CARD BRACKET

(75) Inventors: Mark H. Chen, Palo Alto, CA (US); David W. Hartwell, Bolton, MA (US); Stephen E. Lindquist, Boylston, MA (US); Brett C. Ong, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 11/639,068

(22) Filed: Dec. 14, 2006

(51) Int. Cl.
*H05K 7/02* (2006.01)

(52) U.S. Cl. ............... 361/801; 361/807; 361/809; 361/760; 439/326; 439/62; 439/64

(58) Field of Classification Search .......... 361/726, 361/732, 747, 752, 759, 798, 801, 736, 748, 361/760, 796, 807–810, 756; 439/326, 76.1, 439/638, 62, 64, 327
See application file for complete search history.

(56) References Cited

U.S. PATENT DOCUMENTS

| | | | | |
|---|---|---|---|---|
| 5,103,247 A * | 4/1992 | Sugano et al. | ............... | 361/785 |
| 5,227,664 A * | 7/1993 | Toshio et al. | ............... | 257/723 |
| 5,468,160 A * | 11/1995 | Broschard, III | ............ | 439/567 |
| 5,964,606 A * | 10/1999 | Choy | ......................... | 439/160 |
| 6,103,247 A * | 8/2000 | Boussouira et al. | ......... | 424/401 |
| 6,169,325 B1 * | 1/2001 | Azuma et al. | ............... | 257/685 |
| 6,430,644 B1 * | 8/2002 | Luen et al. | ................... | 710/300 |
| 6,507,496 B2 * | 1/2003 | Levy et al. | ................... | 361/760 |
| 6,724,620 B1 * | 4/2004 | Arbogast et al. | ........... | 361/685 |
| 6,762,943 B2 * | 7/2004 | Yen | ........................... | 361/801 |
| 6,830,470 B1 * | 12/2004 | Lynch et al. | ................ | 439/326 |
| 7,057,901 B2 * | 6/2006 | Roscoe et al. | .............. | 361/796 |
| 7,061,089 B2 * | 6/2006 | Kuzmenka | .................. | 257/686 |

* cited by examiner

*Primary Examiner*—Dean A. Reichard
*Assistant Examiner*—Dameon E. Levi
(74) *Attorney, Agent, or Firm*—Osha • Liang LLP

(57) ABSTRACT

An expansion card bracket for a computer server has an expansion card support attachable to a motherboard and an expansion card accepting portion disposed near a top of the support. The expansion card accepting portion is configured to support an expansion card at an acute angle of inclination with respect to the motherboard. The acute angle of inclination is substantially equal to an angle of inclination of a connector for receiving the expansion card.

8 Claims, 8 Drawing Sheets

25 DEGREE TOOL-LESS EXPANSION CARD BRACKET

BACKGROUND OF INVENTION

1. Field of the Invention

The invention generally relates to a bracket on a computer server for an expansion card.

2. Background Art

Figure 1:
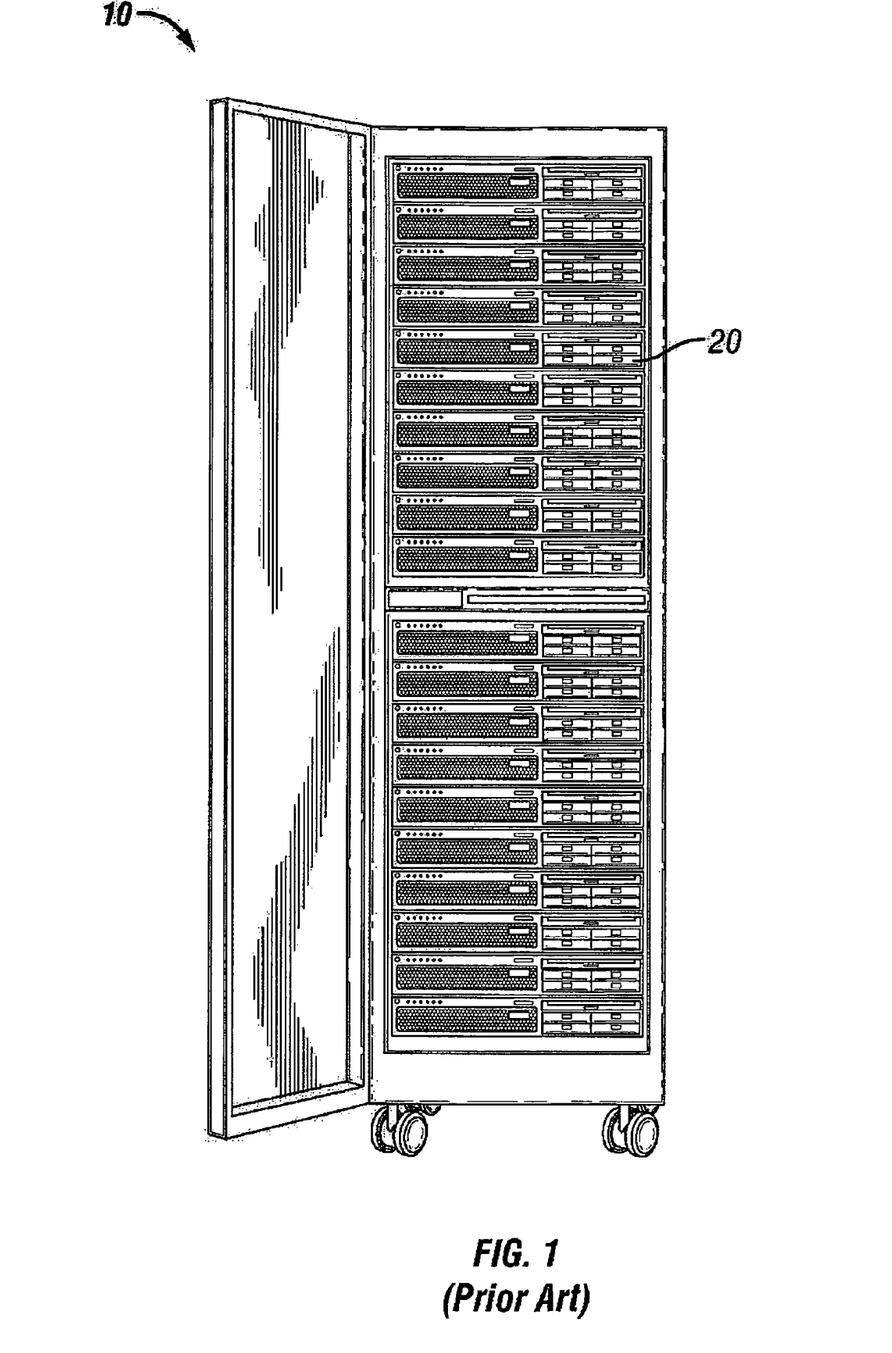
FIG. 1 shows a computer server rack with computer servers disposed therein.
Figure 2:
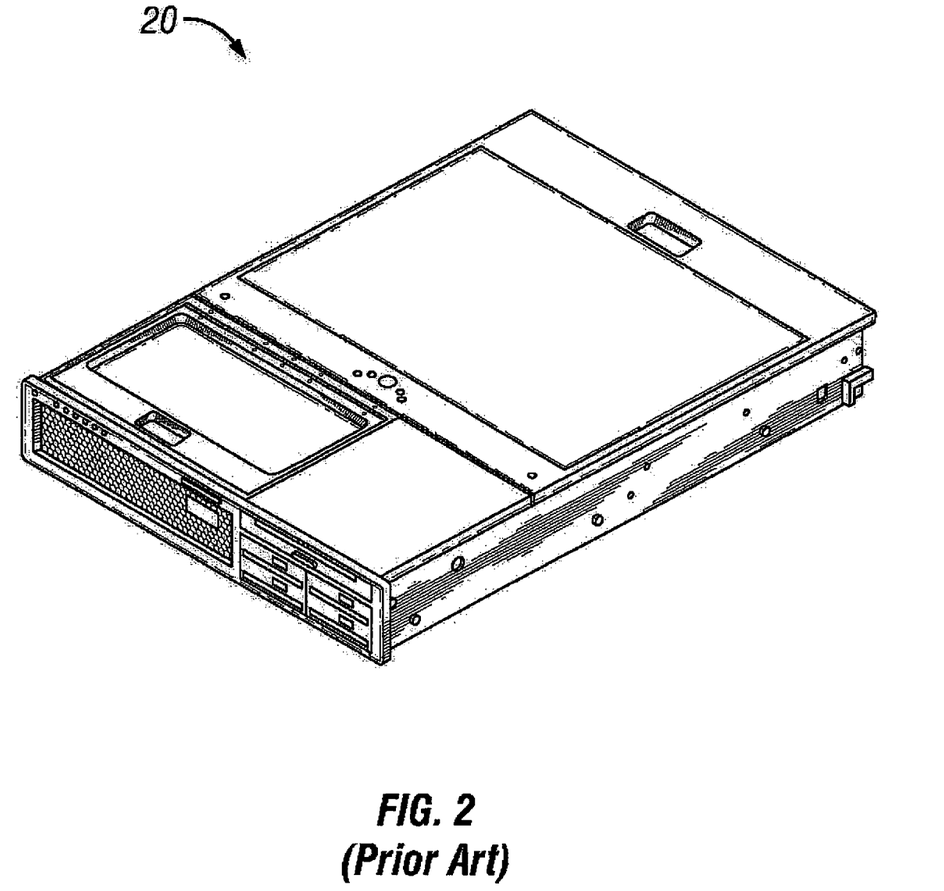
FIG. 2 shows a computer server.

FIG. 1 shows a typical computer server rack 10 with blade servers 20 disposed therein. FIG. 2 shows a perspective view of an individual blade server 20. As can be seen in FIGS. 1 and 2, the computer servers 20 are thin, and there is very little tolerance between the individual blade servers 20 within the computer server rack 10. Thus, any component disposed on a blade server 20 must fit within strict height constraints.

Figure 3:
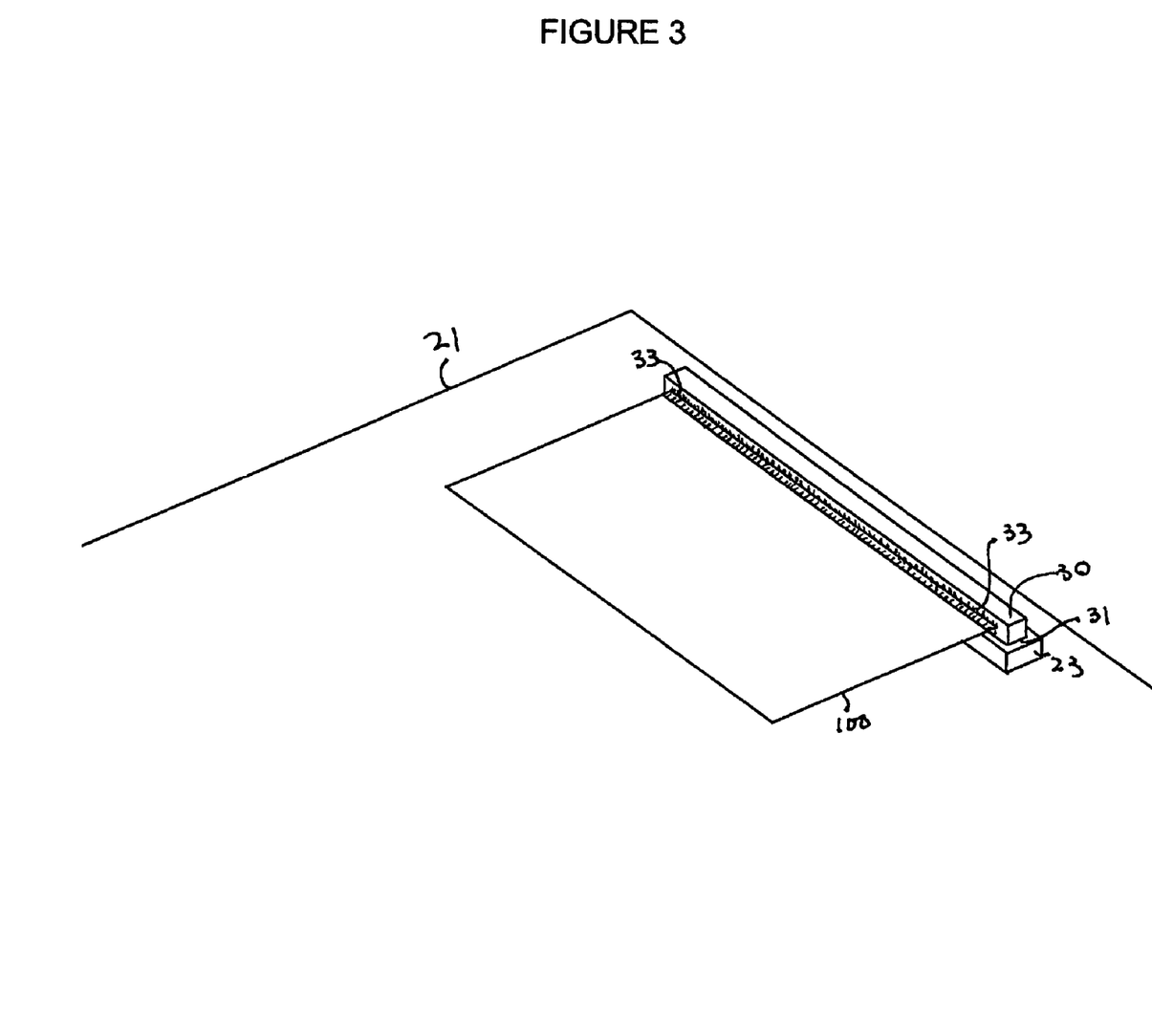
FIG. 3 shows a riser card solution for incorporating an expansion card on a computer server.

The strict height constraints greatly limits the ability to incorporate expansion cards without the addition of custom solutions, such as riser cards. FIG. 3 shows an example of a riser card 30 disposed on a motherboard 21 within a blade server 20. In order to incorporate the expansion cards 100 within the height constraints, a male end 31 of riser card 30 plugs into a vertical expansion card socket 23 on the blade server 20. In turn, the expansion card 100 plugs horizontally into a female end 33 of the riser card 30. The riser card 30 thus allows the expansion card 100 to be parallel with the motherboard 21, and to fit within the strict height constraints of the blade server 20.

SUMMARY OF INVENTION

In general, in one aspect, the invention relates to bracket for supporting an expansion card at an angle, configured to be disposed on a motherboard of a computer server.

In one or more embodiments of the present invention, an expansion card bracket for a computer server, comprises an expansion card support attachable to a motherboard, and an expansion card accepting portion disposed near a top of the support. The expansion card accepting portion is configured to support an expansion card at an acute angle of inclination with respect to the motherboard. The acute angle of inclination is substantially equal to an angle of inclination of a connector for receiving the expansion card.

In one or more embodiments of the present invention, a computer server comprises a motherboard, a connector on the motherboard for receiving an expansion card, and an expansion card bracket on the motherboard. The expansion card comprises an expansion card support attachable to the motherboard, and an expansion card accepting portion disposed near a top of the support. The expansion card accepting portion is configured to support an expansion card at an acute angle of inclination with respect to the motherboard. The acute angle of inclination is substantially equal to an angle of inclination of a connector for receiving the expansion card.

Other aspects and advantages of the invention will be apparent from the following description and the appended claims.

DETAILED DESCRIPTION

Exemplary embodiments of the invention will be described with reference to the accompanying figures. Like items in the figures are shown with the same reference numbers.

In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Embodiments of the invention relate to a bracket on a computer server for an expansion card. More specifically, one or more embodiments of the invention relate to a bracket on a computer server for securing an expansion card onto the computer server at an angle without the need for tools.

Figure 4:
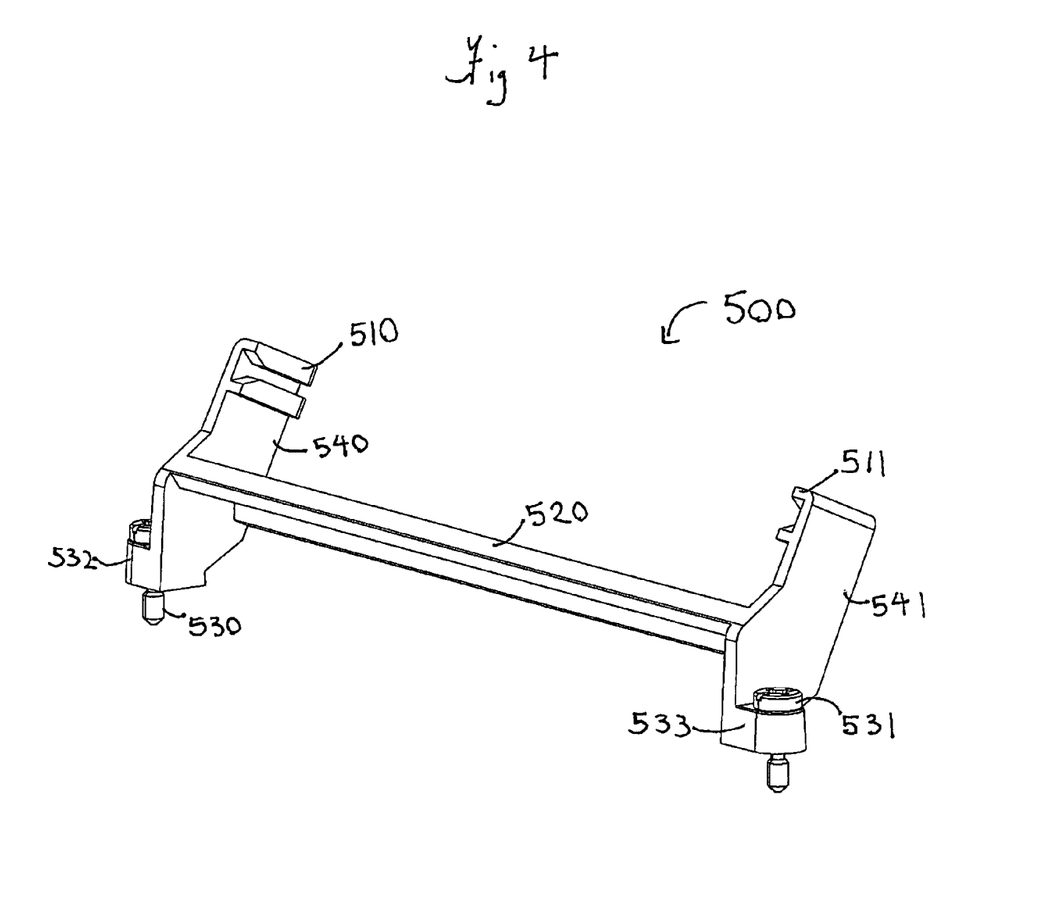
FIG. 4 shows a perspective view of an angled tool-less expansion card bracket according to one or more embodiments of the present invention.

FIG. 4 shows a perspective view of an angled tool-less expansion card bracket 500, according to one or more embodiments of the present invention. The angled tool-less expansion card bracket 500 has angled supports 540, 541, spaced apart a distance slightly greater than the width of an expansion card 100. The angled supports 540, 541 are connected by a bridge 520. At the top of the angled supports 530, 531 are disposed card accepting portions 510, 511. Each of the card accepting portions 510, 511 is essentially two parallel protrusions disposed at the top of the angled support 540, 541, spaced apart a distance slightly greater than the thickness of the expansion card 100. The card accepting portions 510, 511 are disposed such that they face each other. The protrusions making up the card accepting portions 510, 511 are chamfered at the corners where the cards are inserted, such that the cards can be easily inserted.

At the bottom of the angled supports 540, 541 are attachment portions 532, 533 for attaching the angled tool-less expansion card bracket 500. In the embodiment shown in FIG. 4, the attachment portions 532, 533 extend outward from the angled support 540, 541, and has holes into which, for example, screws 530, 531 are inserted. However, the attachment portions 532, 533, can be any shape, and the attachment mechanism is not limited to screws 530, 531. Instead, those skilled in the art will appreciate various other ways that the angled tool-less expansion card bracket 500 can be attached to a motherboard 21 including but not limited to clips, pins, nuts and bolts, adhesives, solder, etc. Further, screws 530, 531 could be thumbscrews which allow tool-less attachment of the angled tool-less expansion card bracket 500 to the motherboard 21.

Figure 5:
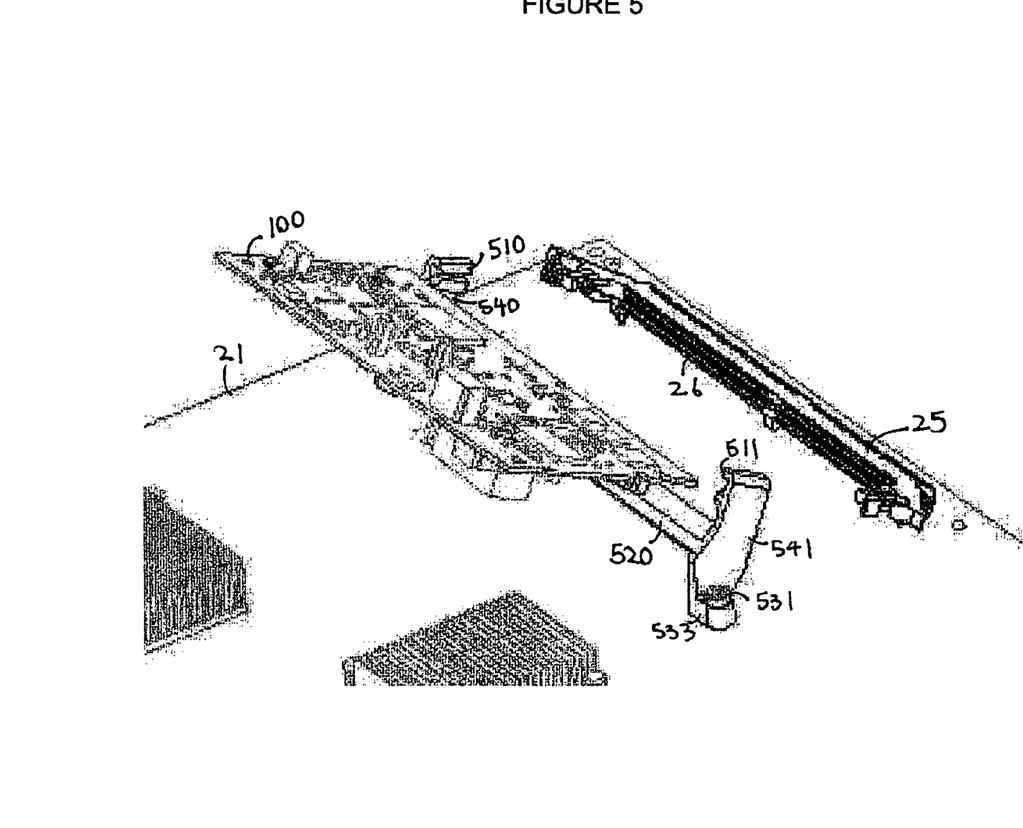
FIG. 5 shows a perspective view of an angled tool-less expansion card bracket attached to the motherboard according to one or more embodiments of the present invention.
Figure 6:
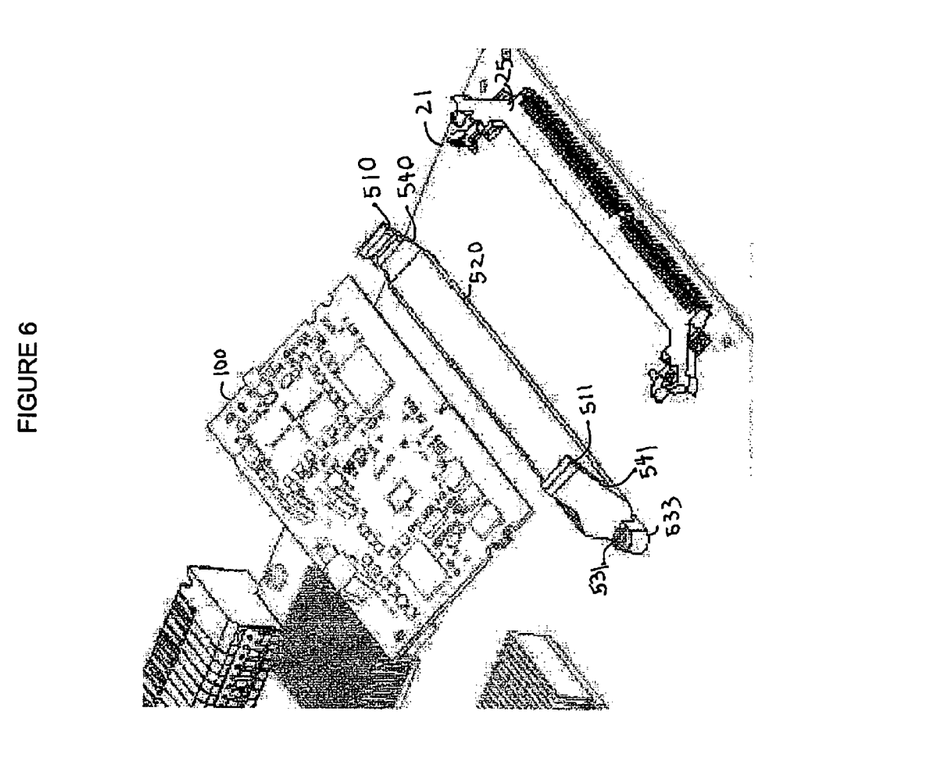
FIG. 6 shows a reverse perspective view of an angled tool-less expansion card bracket attached to the motherboard according to one or more embodiments of the present invention.

FIG. 5 shows a perspective view and FIG. 6 shows a reverse perspective view of an angled tool-less expansion card bracket 500 attached to a motherboard 21 according to one or more embodiments of the present invention. The motherboard 21 has an angled expansion socket 25 having a slot 26 configured to receive the expansion card 100. The angled tool-less expansion card bracket 500 is attached to the motherboard 21 via screws 530, 531 at the attachment portions 532, 533.

An angle of inclination of the angled tool-less expansion card bracket 500 with respect to the motherboard 21 is substantially equal to the angle of inclination of the angled expansion socket 25 with respect to the motherboard 21. Here, the angle of inclination of the angled tool-less expansion card bracket 500 can be measured, for example, by drawing a line parallel with one of the parallel protrusions making up the card accepting portions 510, 511, and measuring the angle made with the plane of the motherboard 21. It is not necessary for the angled supports 540, 541 to be angled, as long as the card accepting portions have the necessary angle of inclination with respect to the motherboard. The angle of inclination of the angled expansion socket 25 is measured using the orientation of the slot 26.

In one or more embodiments, the angle of inclination for the angled expansion socket 25 is substantially equal to 25°. This is because 25° is a standard angle for some connector components used on motherboards. However, embodiments of the present invention are not limited to a substantially 25° angle of inclination. The angled expansion socket 25 can have any angle of inclination and be within the scope of the invention, as long as the expansion card 100, when inserted into the angled expansion socket 25, fits within the confines of the blade server 20. The card accepting portions 510, 511 and the slot 26 are coplanar so that the expansion card 100, when inserted into the card accepting portions 510, 511, can be guided straight into the slot 26 of the angled expansion socket 25.

Figure 7:
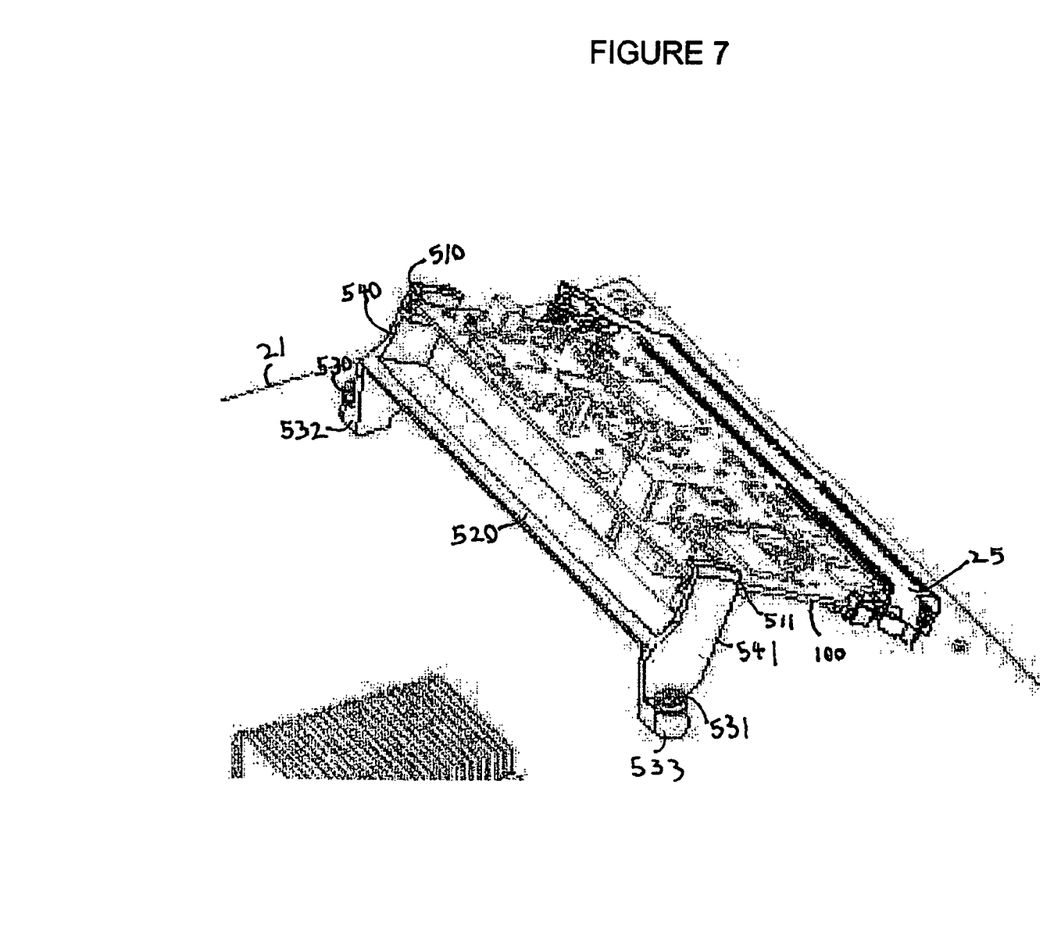
FIG. 7 shows a perspective view of an angled tool-less expansion card bracket securing an expansion card inserted into an angled expansion socket according to one or more embodiments of the present invention.
Figure 8:
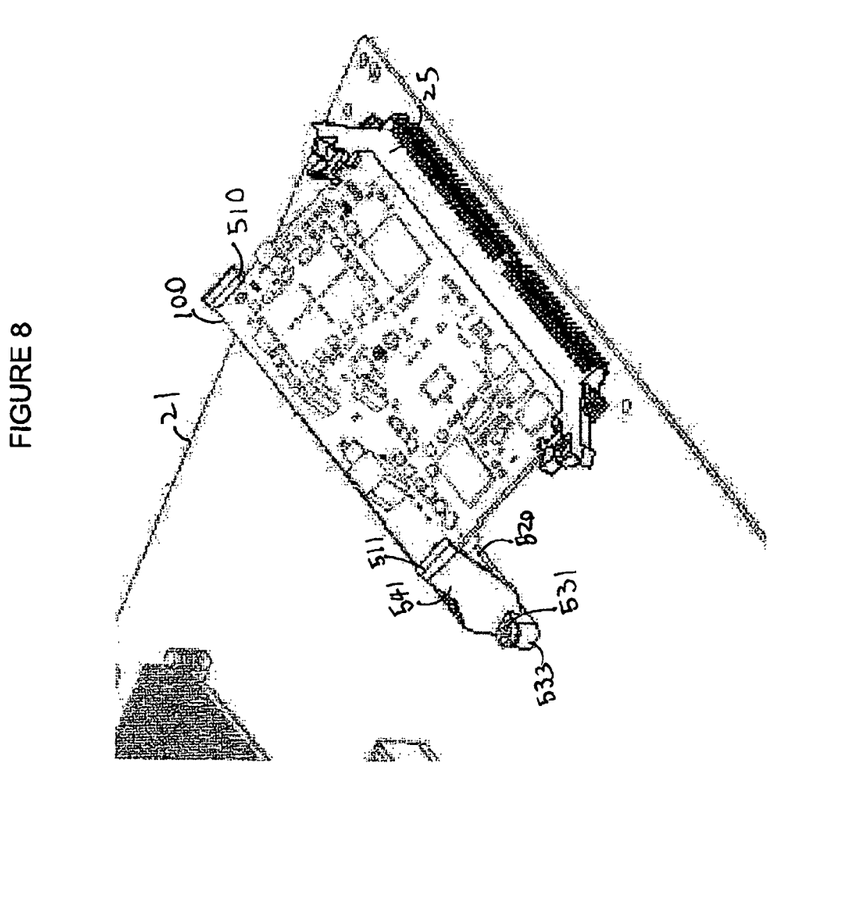
FIG. 8 shows a reverse perspective view of an angled tool-less expansion card bracket securing an expansion card inserted into an angled expansion socket according to one or more embodiments of the present invention.

FIG. 7 shows a perspective view and FIG. 8 shows a reverse perspective view of an angled tool-less expansion card bracket securing an expansion card inserted into an angled socket according to one or more embodiments of the present invention. The expansion card 100 is inserted at an angle into the card accepting portions 510, 511, and guided by the card accepting portions 510, 511 into the slot 26 of the angled expansion socket 25.

An angled tool-less expansion card bracket 500 according to one or more embodiments of the present invention may have one or more of the following advantages. The angled tool-less expansion card bracket 500 allows component clearance of the expansion card 100 within the strict height constraints of a blade server 20 while maximizing real-estate usage with minimal impact to the board component clearance. The angled tool-less expansion card bracket 500 provides support and stability to the expansion card 100 once the expansion card 100 is inserted into the angled expansion socket 25. Because the angled tool-less expansion card bracket 500 allows the expansion card 100 to be inserted directly into the angled expansion socket 25, expensive and complicated custom riser card solutions becomes unnecessary when incorporating expansion cards 100 onto a blade server 20. Further, because of the inclination angle, the expansion card 100 can be inserted simply, and without the use of tools. Because insertion of the expansion card 100 requires no tools, the angled tool-less expansion card bracket 500 allows for simple assembly and servicing of the expansion card. The simple design and minimal part count of the angled tool-less expansion card bracket 500 optimizes part and assembly cost. Further, in one or more embodiments, the use of a standard 25 degree angle of inclination allows further cost reduction.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An expansion card bracket for a computer server, comprising:
    an expansion card support attachable to a motherboard separately from a connector for receiving an expansion card,
    an expansion card accepting portion disposed near a top of the support,
    a pair of expansion card supports, and
    a bridge connecting the pair of expansion card supports,
    wherein the expansion card accepting portion is configured to support an expansion card at an acute angle of inclination with respect to the motherboard, and
    wherein the acute angle of inclination is substantially equal to an angle of inclination of the connector.

2. The expansion card bracket of claim 1, further comprising:
    an attachment portion at a bottom of the expansion card support, wherein the bracket is attached to the motherboard via the attachment portion.

3. The expansion card bracket of claim 1, wherein:
    the pair of expansion card supports are angled against the motherboard at the acute angle of inclination.

4. The expansion card bracket of claim 1, wherein:
    the expansion card accepting portion on each of the pair of expansion card supports is a pair of parallel protrusions, the protrusions being apart a distance slightly larger than the thickness of the expansion card.

5. The expansion card bracket of claim 1, wherein:
    the angle of inclination is substantially 25 degrees.

6. The expansion card bracket of claim 1, wherein:
    an expansion card support is configured to attach to the motherboard with screws.

7. A computer server comprising:
    a motherboard,
    a connector on the motherboard for receiving an expansion card, and
    an expansion card bracket on the motherboard, the expansion card bracket comprising:
        an expansion card support attachable to the motherboard separately from the connector,
        an expansion card accepting portion disposed near a top of the support,
        a pair of expansion card supports, and
        a bridge connecting the pair of expansion card supports,
        wherein the expansion card accepting portion is configured to support an expansion card at an acute angle of inclination with respect to the motherboard, and
        wherein the acute angle of inclination is substantially equal to an angle of inclination of the connector.

8. The computer server of claim 7, wherein the angle of inclination is substantially 25 degrees.

* * * * *